United States Patent
Grose et al.

(10) Patent No.: US 6,384,643 B1
(45) Date of Patent: May 7, 2002

(54) TEMPERATURE AND PROCESS COMPENSATED LDMOS DRAIN-SOURCE VOLTAGE

(75) Inventors: William E. Grose, Plano; Eugene G. Dierschke, Dallas; Jingwei Xu, Plano, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/721,393

(22) Filed: Nov. 22, 2000

Related U.S. Application Data

(60) Provisional application No. 60/171,062, filed on Dec. 16, 1999.

(51) Int. Cl.[7] .............................................. H03K 17/14
(52) U.S. Cl. ...................... 327/112; 327/333; 327/362; 327/378; 327/513
(58) Field of Search ................................. 327/108, 112, 327/333, 362, 378, 436, 437, 513

(56) References Cited

U.S. PATENT DOCUMENTS

| | | | | |
|---|---|---|---|---|
| 4,529,889 A | * | 7/1985 | Dumbri | 327/112 |
| 4,713,600 A | * | 12/1987 | Tsugaru et al. | 327/333 |
| 5,157,281 A | * | 10/1992 | Santin et al. | 327/333 |
| 5,376,846 A | * | 12/1994 | Houston | 327/108 |
| 5,481,213 A | * | 1/1996 | Johnson | 327/112 |
| 5,912,577 A | * | 6/1999 | Takagi | 327/333 |
| 5,990,711 A | * | 11/1999 | Sekimoto | 327/112 |
| 6,066,975 A | * | 5/2000 | Matano | 327/333 |
| 6,265,915 B1 | * | 7/2001 | Rider et al. | 327/112 |

* cited by examiner

Primary Examiner—Terry D. Cunningham
(74) Attorney, Agent, or Firm—Alan K. Stewart; Wade James Brady, III; Frederick J. Telecky, Jr.

(57) ABSTRACT

Driver circuitry (300) is disclosed, incorporating feedback circuitry (310) inter-coupled with reference circuitry (348) to equalize the voltage level of an output (328) with a reference voltage source (320) in the reference circuitry; where the driver circuitry comprises a first transistor (340) having a first terminal coupled to a voltage source (342), a second terminal coupled to an input (336), and a third terminal coupled to a resistor (344), a second transistor (338) having a first terminal coupled to ground (332), a second terminal coupled to an input (334), and a third terminal coupled to a resistor (346), a third transistor (318) having a first terminal coupled to the output, a second terminal (326) coupled jointly to the resistors, and a third terminal coupled to ground, and a resistor (330) coupling the output to a voltage source (306).

15 Claims, 1 Drawing Sheet

TEMPERATURE AND PROCESS COMPENSATED LDMOS DRAIN-SOURCE VOLTAGE

This application claims priority under 35 USC § 119 (e) (1) of provisional application no. 60/171,062, filed Dec. 16, 1999.

TECHNICAL FIELD OF THE INVENTION

The present invention relates, in general, to high current circuitry used in electronic devices, and in particular, to feedback circuitry providing constant drain-source voltage without temperature or process variation.

BACKGROUND OF THE INVENTION

The continual demand for enhanced circuit performance places a number of demands on circuitry designs. High current driver circuitry is one such demanding circuitry application. MOS (metallic oxide semiconductor) devices are commonly used in high current applications. For example, LDMOS (Lateral Diffused MOS) devices are often used to provide switching functionality. The LDMOS process is often more area efficient, and therefore less costly, than other comparable semiconductor processes. However, $R_{DS(on)}$ (drain-source on-resistance) for LDMOS can vary greatly; being typically very temperature dependent for a fixed gate-source voltage. Also, $R_{DS(on)}$ can vary greatly over normal wafer fab process limits. As a result, LDMOS drain-source voltage in such applications may vary greatly; thus affecting current and power supplied to a load, and overall system performance and reliability.

Previously, applications incorporated no solution to such problems, suffering the consequences and sacrificing system performance. Some attempts were made to address singular aspects of the variance problems; leaving other aspects unaddressed and remaining to degrade system performance. For example, a previous approach may have generated a temperature dependent gate-source voltage by varying gate drive supply voltage. Such an approach does not completely address variance, however, as the temperature dependent gate-source voltage is not closely matched to LDMOS characteristics, and thus only partial temperature compensation of $R_{DS(on)}$ is achieved. Such a technique does not compensate for process variations, and does not maintain consistent drain-source voltage as load current is varied. Thus, conventional systems typically don't address impacts of and the need for constant drain-source voltage (without temperature or process variation), or address them incompletely (only one-dimensionally).

SUMMARY OF THE INVENTION

Therefore, circuitry which adjusts gate-source voltage to maintain approximately a constant drain-source voltage, immunizing system circuitry from effects of $R_{DS(on)}$ variation, is now needed; providing enhanced design performance while overcoming the aforementioned limitations of conventional methods.

In the present invention, a feedback circuit is provided to adjust gate-source voltage; maintaining approximately constant drain-source voltage and immunizing the system circuitry from effects of $R_{DS(on)}$ variation by compensating that variation. This feedback approach utilizes drain-source voltage to generate required gate-source voltage over temperature, process, and current variations; maintaining constant drain-source voltage.

In one embodiment of the present invention, feedback circuitry is inter-coupled with driver and reference circuitry. The system of circuits, particularly the feedback circuitry, operates to equalize the voltage level of an output in the driver circuitry with a reference voltage source in the reference circuitry.

Another embodiment of the present invention provides for multiple instances of the driver and feedback circuits to be switchably coupled to a single reference circuit.

BRIEF DESCRIPTION OF THE DRAWINGS

For a more complete understanding of the features and advantages of the present invention, reference is now made to the detailed description of the invention along with the accompanying figures in which corresponding numerals in the different figures refer to corresponding parts and in which.

DETAILED DESCRIPTION OF THE INVENTION

While the making and using of various embodiments of the present invention are discussed in detail below, it should be appreciated that the present invention provides many applicable inventive concepts which can be embodied in a wide variety of specific contexts. The specific embodiments discussed herein are merely illustrative of specific ways to make and use the invention and do not delimit the scope of the invention.

It should be understood that the principles and applications disclosed herein can be applied to circuitry produced in a wide range of semiconductor process technologies. For purposes of explanation and illustration, the present invention is hereafter described in reference to low-side driver circuitry using LDMOS semiconductor processes. However, the same approach may be used to implement a number of high current circuitry applications. For example, this same low-side driver configuration could use either regular DMOS or NMOS (n-type MOS) transistors. Alternatively, the present invention may be utilized in high-side driver circuitry using a PMOS (p-type MOS) semiconductor process.

Figure 1:
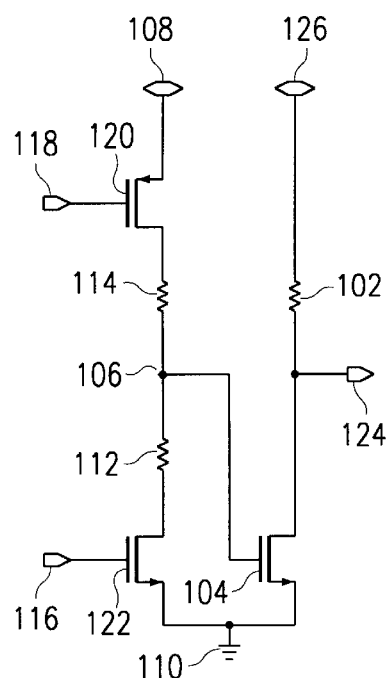
FIG. 1 is a representative schematic of a prior art low-side driver circuit.

Referring now to FIG. 1, a prior art implementation of a low-side driver circuit system 100 is illustrated. FIG. 1 illustrates LDMOS used for a low-side switch to control current flowing through a load resistor connected to a voltage supply. Also shown is an LDMOS gate drive circuit. In general, system 100 functions to deliver a fixed amount of energy to an output load resistor 102. System quality and efficiency depends on how accurately the energy across resistor 102 can be controlled. In system 100, an LDMOS device 104 functions as a switch. In order to control the energy across resistor 102, output voltage ($V_{out}$) across device 104 must be controlled. Any variation in voltage across resistor 102 will impact the power delivered across resistor 102; which varies as the square of the voltage drop across the resistor ($P(V)^2/R$). Often, applications such as system 100 will have requirements or limitations as to how much $V_{out}$ can vary with respect to temperature, process, and current loading.

Some conventional systems utilized bipolar circuitry design in similar applications; in which $V_{out}$ variance was not as great a concern. Cost and other performance requirements, however, led system designers to use of LDMOS and similar technologies. The inherent properties of LDMOS and related technologies result in greater $R_{DS(on)}$ variance for a given design than bipolar technology; particularly over process and especially over temperature. $R_{DS(on)}$ can vary substantially over temperature. System designers have previously sacrificed the resulting performance issues in order to use the more cost-effective technologies.

Referring back to FIG. 1, gate voltage for device 104 may be measured at node 106. Node 106 switches between high voltage source 108, which is typically about 12 to 13 volts, and ground 110. Voltage 108 is a power supply voltage, designed to be constant. Resistors 112 and 114, in combination with gate capacitance, determine rise and fall times associated with the transition. Prior attempts at refinement of such circuitry have tried adding temperature dependent voltage sources. Such approaches are very limited, however, because of the difficulty in accurately controlling voltage as a function of temperature. Further, these approaches have provided no ability to compensate for process variations characteristic of the process technology itself.

System 100 operates in either an "on" or "off" mode, depending on the desired power across resistor 102. In "off" mode, preceding circuitry sets voltage inputs 116 and 118 high. Device 120 is PMOS, and thus always in opposite phase to NMOS device 122. As a result, device 120 is off and node 106 couples to ground 110 by device 122. Thus, device 104 is off; no current will flow through resistor 102 and as a result voltage output 124 is pulled up to load voltage 126 (which equals "high"). As system 100 switches to "on" mode, inputs 116 and 118 transition low; turning device 120 on and device 122 off. As a result, node 106 is coupled to voltage 108, and device 104 turns on; coupling output 124 to ground and establishing a power load across resistor 102. Current flows through resistor 114 to charge the gate capacitance of device 104. The value of resistor 114 is selected to give a required output voltage fall-time. Once steady-state is reached, voltage at node 106 equals voltage 108. The value of output 124 will be dependent on current and the on-resistance ($R_{DS(on)}$), which varies over process limits and is very temperature dependent ($R_{DS(on)}$ increases with increasing temperature). System 100 transitions again, and voltage inputs 116 and 118 change high. This again turns off device 104. The value of resistor 112 is selected to achieve a required output voltage rise-time.

Variance in $R_{DS(on)}$ negatively impacts performance of system 100 because it results in variance of voltage 124. This, in turn, causes voltage across resistor 102 to vary; having a squared effect in terms of power variance across resistor 102 ($P(V)^2/R$). As previously noted, prior attempts to solve this problem included use of a bipolar output circuitry; which typically exploited the base to emitter voltage ($V_{be}$) characteristics of bipolar devices. $V_{be}$ of bipolar devices tends to be stable; but varies with temperature (and process, to a lesser degree). Bipolar technology typically sees logarithmic variance with current, which results in nominal variance due to current variance.

Other prior approaches using LDMOS have varied supply voltage 108; increasing the voltage as a function of temperature, impacting the voltage at node 106 and therefore $R_{DS(on)}$. Thus, voltage 108 could be designed to increase with increasing temperature, to reduce $R_{DS(on)}$ variations. As a result, maintaining a constant $R_{DS(on)}$ required a significant variation of the gate to source voltage of device 104 and therefore voltage 108. Appropriate temperature variation of voltage 108 was difficult to generate such that it gave good compensation over temperature. Also, having a temperature dependent voltage 108 did not compensate for process variations and did not maintain drain-source voltage as current was varied. Designing a system to adjust voltage 108 based on temperature was thus rather difficult and inefficient.

Figure 2:
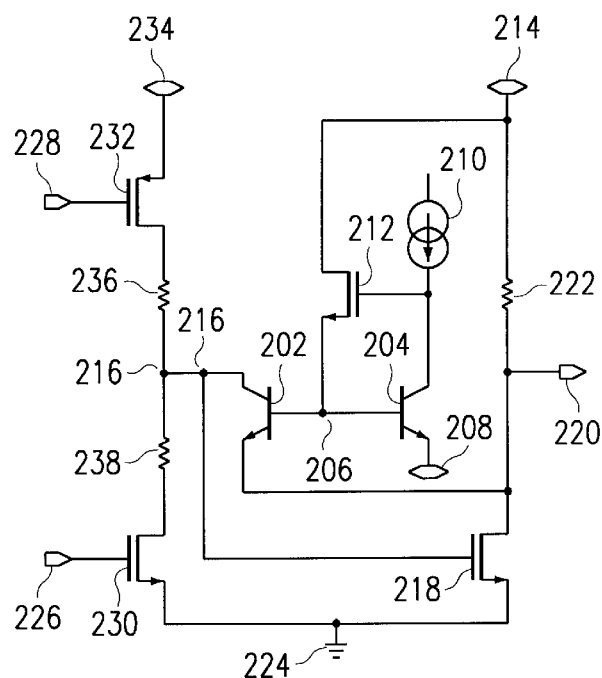
FIG. 2 is an illustrative schematic of a low-side driver circuit according to the present invention.

Referring now to FIG. 2, a low-side driver circuit system 200 is illustrated in accordance with the present invention. System 200 comprises substantially the same members as found in system 100. In addition, system 200 comprises a matched pair of NPN transistors 202 and 204 sharing a common base 206. The emitter of transistor 204 couples to a voltage reference 208. A bias current 210 couples to the collector of transistor 204 to drive current therethrough. NMOS device 212 supplies required current at base 206. Device 212 has its drain coupled to base 206, its gate coupled to the collector of transistor 204, and its source coupled to load voltage 214. Voltage at base 206 equals voltage 208 plus $V_{be}$ of transistor 204. The combination of device 212, transistor 204, and bias current 210 compensates for temperature effect variation in $V_{be}$ of transistor 202.

The collector of transistor 202 couples to the gate 216 of LDMOS device 218, while the emitter of transistor 202 couples to the source of device 218. Voltage output 220 also couples to the source of device 218, as does one end of resistor 222; which couples at its other end to voltage 214. The drain of device 218 couples to ground 224. Voltage inputs 226 and 228 couple to the gates of devices 230 and 232, respectively. The source of device 232 couples to high voltage source 234. The drain of device 232 couples to one end of resistor 236; which couples at its other end to gate 216. The drain of device 230 couples to ground 224. The source of device 230 couples to one end of resistor 238; which couples at its other end to gate 216.

The present invention utilizes negative feedback keep the voltage at output 220 roughly equivalent to reference voltage 208. When device 218 is initially turned on, voltage at output 220 will decrease from voltage 214. When the voltage at output 220 decreases to approximately the voltage of reference 208, transistor 202 will draw sufficient current so that the voltage drop across resistor 236 is sufficient to limit the voltage at gate 216 to a particular value; the value required to render the $R_{DS(on)}$ of device 218 necessary to generate voltage at output 220 equal to the reference voltage 208.

More particularly, when the voltage at output 220 drops due to $R_{DS(on)}$ variations of device 218, $V_{be}$ of transistor 202 increases; because the base of transistor 202 is fixed at base 206 by the bias voltage established through transistor 204. Consequently, the collector current across transistor 202 increases, which results in an increase in the voltage across resistor 236. The voltage at the drain of device 232 remains constant, roughly equivalent to voltage 234. Thus, the voltage at gate 216 decreases and the $R_{DS(on)}$ of device 218 is increases. Voltage at output 220 increases until balancing out approximately equal to reference voltage 208. The drain-source voltage across device 218 is maintained at a constant level.

Thus, the present invention provides compensation addressing both LDMOS temperature and process variations. Drain-source voltage can also be maintained as current is varied.

Figure 3:
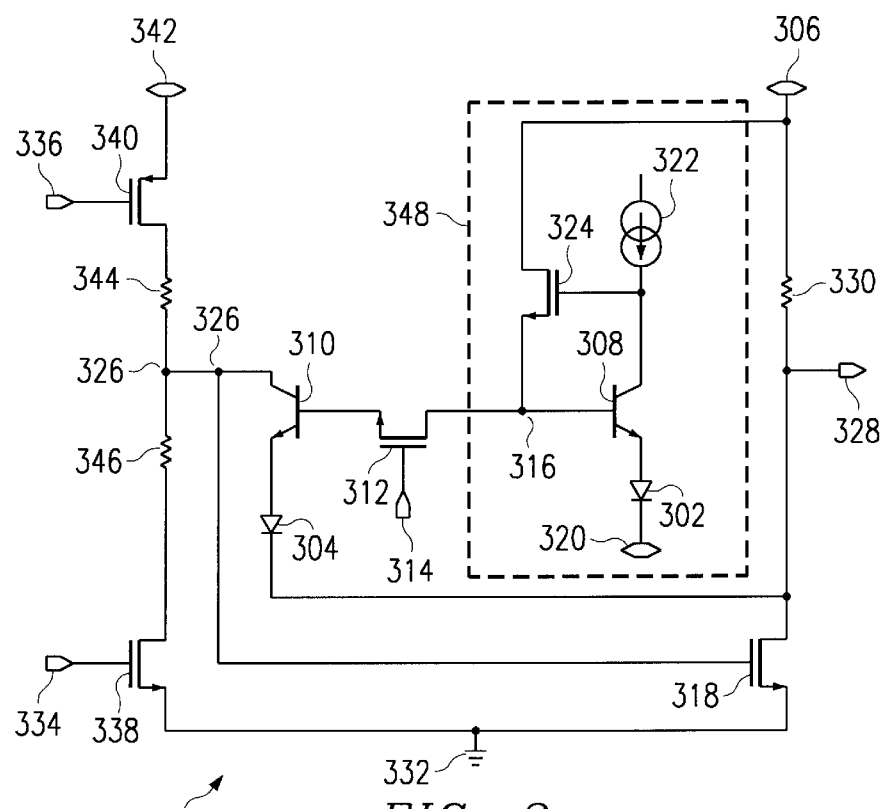
FIG. 3 is an illustrative schematic of another low-side driver circuit according to the present invention.

FIG. 3 illustrates another embodiment of a low-side driver circuit system 300 according to the present invention. System 300 is similar to system 200; comprising some additional structures. System 300 incorporates blocking diodes 302 and 304; provided to enable load voltage 306 to be relatively high. Without blocking diodes, the load voltage may be limited by NPN emitter-base breakdown voltage of transistors 308 and 310. NMOS switch 312 has also been added. The drain of switch 312 couples to the base of transistor 310. The gate of switch 312 couples to voltage input 314; while its source couples to node 316. A first end of diode 304 couples to the emitter of transistor 310. A second end of diode 304 couples to the source of LDMOS device 318. A first end of diode 302 couples to the emitter of transistor 308. A second end of diode 302 couples to reference voltage 320. The base of transistor 308 couples to node 316. The collector of transistor 308 couples jointly to bias current 322 and to the gate of NMOS device 324. The source of device 324 couples to voltage 306; and its drain couples to node 316. The collector of transistor 310 couples to the gate 326 of device 318. Voltage output 328 couples to the source of device 318, as does one end of resistor 330; which couples at its other end to voltage 306. The drain of device 318 couples to ground 332. Voltage inputs 334 and 336 couple to the gates of devices 338 and 340, respectively. The source of device 340 couples to high voltage source 342. The drain of device 340 couples to one end of resistor 344; which couples at its other end to gate 326. The drain of device 338 couples to ground 332. The source of device 338 couples to one end of resistor 346; which couples at its other end to gate 326.

System 300 functions in substantially the same manner as system 200; with some variation. As previously noted, system 300 incorporates blocking diodes 302 and 304 to address load voltage limitation. Switch 312 is provided such that a single reference circuit 348 may be shared by multiple instances of circuit system 300. Reference circuit 348 comprises bias current 322, device 324, transistor 308, and diode 302; and couples to system 300 at node 316 via switch 312. Switch 312 is utilized to activate or de-active access to circuit 348 by system 300. Input 314 will transition to a "high" level, activating switch 312 and system 300 when output 328 is being activated. Input 314 will transition to a "low" level, de-activating switch 312 and system 300 when output 328 is not utilized. For example, a single semiconductor device may comprise multiple instances of system 300 (one for each output) while only requiring a single instance of circuit 348. As such, the present invention achieves the necessary compensation and system balancing in an efficient and cost-effective manner.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. The illustrations provided herein apply to implementations in which Drain-Source voltage of a low-side LDMOS device is controlled. The teachings and concepts of the present invention may be applied to other types of components and circuits, such as using regular NMOS instead of LDMOS or using NMOS transistors in place of NPN transistors. The feedback circuit could be applied to provide control of collector-emitter voltage of NPN driver instead of the LDMOS driver illustrated. As previously noted, the feedback circuit could be applied to high-side driver applications; utilizing LDMOS or similar components, or utilizing PMOS driver and PNP(or PMOS) feedback circuitry. Thus, the principles of the present invention are practicable in a number of applications and technologies. It is therefore intended that the appended claims encompass any such modifications or embodiments.

What is claimed is:

1. A temperature and process compensated circuitry system comprising:

a first transistor having a first terminal coupled to a first voltage source, a second terminal coupled to a first input, and a third terminal coupled to a first end of a first resistor;

a second transistor having a first terminal coupled to ground, a second terminal coupled to a second input, and a third terminal coupled to a first end of a second resistor;

a third transistor having a first terminal coupled to an output, a second terminal coupled jointly to a second end of said first and second resistors, and a third terminal coupled to ground;

a third resistor, coupled at a first end to said output and at a second end to a second voltage source;

a feedback circuit coupled between said output and the second terminal of said third transistor; and a reference circuit coupled to said feedback circuit.

2. The system of claim 1 wherein said feedback circuit further comprises a feedback transistor having a first terminal coupled to the second terminal of said third transistor, a second terminal coupled to said output, and a third terminal coupled to said reference circuit.

3. The system of claim 2 further comprising a switch device having a first terminal coupled to the third terminal of said feedback transistor, a second terminal coupled to a third input, and a third terminal coupled to said reference circuit.

4. The system of claim 2 wherein said reference circuit further comprises:

a current source;

a fourth transistor having a first terminal coupled to the third terminal of said feedback transistor, a second terminal coupled to a third voltage source, and a third terminal coupled to said-current source; and a fifth transistor having a first terminal coupled to the first terminal of said fourth transistor, a second terminal coupled to said current source, and a third terminal coupled to said second voltage source.

5. The system of claim 3 wherein said reference circuit further comprises:

a current source;

a fourth transistor having a first terminal coupled to the third terminal of said switch device, a second terminal coupled to a third voltage source, and a third terminal coupled to said current source; and a fifth transistor having a first terminal coupled to the first terminal of said fourth transistor, a second terminal coupled to said current source, and a third terminal coupled to said second voltage source.

6. The system of claim 5 further comprising a diode interposed between the first terminal of said feedback transistor and the second terminal of said third transistor.

7. The system of claim 6 further comprising a diode interposed between the second terminal of said fourth transistor and said third voltage source.

8. The system of claim 4 wherein said third transistor is an LDMOS device.

9. The system of claim 8 wherein said fourth and feedback transistors are bipolar devices.

10. The system of claim 7 wherein said third transistor is an LDMOS device.

11. The system of claim 10 wherein said fourth and feedback transistors are bipolar devices.

12. A method of compensating temperature and process variation effects on driver circuitry resistance, said method comprising the steps of:

providing a voltage output;

providing a first transistor having a first terminal coupled to a first voltage source, a second terminal coupled to a first input, and a third terminal coupled to a first end of a first resistor;

providing a second transistor having a first terminal coupled to ground, a second terminal coupled to a second input, and a third terminal coupled to a first end of a second resistor;

providing a third transistor having a first terminal coupled to said voltage output, a second terminal coupled jointly to a second end of said first and second resistors, and a third terminal coupled to ground;

providing a third resistor, coupled at a first end to said voltage output and at a second end to a second voltage source;

providing a feedback circuit coupled between said output and the second terminal of said third transistor;

providing a reference voltage circuit coupled to said feedback circuit; and equalizing said voltage output with a reference voltage originating from said reference voltage circuit.

13. The method of claim 12 wherein the step of providing a feedback circuit further comprises providing a feedback transistor having a first terminal coupled to the second terminal of said third transistor, a second terminal coupled to said voltage output, and a third terminal coupled to said reference circuit.

14. The method of claim 13 wherein the step of providing a reference voltage circuit further comprises the steps of:

providing a current source;

providing a fourth transistor having a first terminal coupled to the third terminal of said feedback transistor, a second terminal coupled to a third voltage source, and a third terminal coupled to said current source; and providing a fifth transistor having a first terminal coupled to the first terminal of said fourth transistor, a second terminal coupled to said current source, and a third terminal coupled to said second voltage source.

15. Circuitry comprising:

a first transistor having a first terminal coupled to a first voltage source, a second terminal coupled to a first input, and a third terminal coupled to a first end of a first resistor;

a second transistor having a first terminal coupled to ground, a second terminal coupled to a second input, and a third terminal coupled to a first end of a second resistor;

a third transistor having a first terminal coupled to a first output, a second terminal coupled jointly to a second end of said first and second resistors, and a third terminal coupled to ground;

a fourth transistor having a first terminal coupled to the second terminal of said third transistor, a second terminal coupled to said first output by a first diode, and a third terminal;

a fifth transistor having a first terminal coupled to the third terminal of said fourth transistor, a second terminal coupled to a third input, and a third terminal;

a third resistor, coupled at a first end to said first output and at a second end to a second voltage source;

a sixth transistor having a first terminal coupled to the third terminal of said fifth transistor, a second terminal coupled to a third voltage source by a second diode, and a third terminal coupled to a current source; and a seventh transistor having a first terminal coupled to the first terminal of said sixth transistor, a second terminal coupled to said current source, and a third terminal coupled to said second voltage source.

* * * * *